United States Patent [19]
Tanabe et al.

[11] Patent Number: 5,648,734
[45] Date of Patent: Jul. 15, 1997

[54] BUFFER CIRCUIT AND BIAS CIRCUIT

[75] Inventors: Tetsuya Tanabe; Satoru Tanoi, both of Tokyo, Japan

[73] Assignee: Oki Electric Industry Co., Ltd., Tokyo, Japan

[21] Appl. No.: 566,955

[22] Filed: Dec. 4, 1995

[30] Foreign Application Priority Data

Dec. 26, 1994 [JP] Japan ................... 6-322327

[51] Int. Cl.$^6$ ................ H03K 19/0948; H03K 19/017
[52] U.S. Cl. ................ 326/115; 326/17; 326/34; 326/83; 327/67; 327/313; 327/323
[58] Field of Search ................ 326/115, 119, 326/121, 17, 68, 73, 126, 86, 83, 31, 34; 327/313, 318, 323, 65, 67

[56] References Cited

U.S. PATENT DOCUMENTS

| | | | |
|---|---|---|---|
| 4,450,371 | 5/1984 | Bismarck | 326/83 |
| 4,570,084 | 2/1986 | Griffin et al. | 326/115 |
| 4,616,189 | 10/1986 | Pengue, Jr. | |
| 4,972,097 | 11/1990 | You | |
| 5,045,807 | 9/1991 | Ishihara et al. | 326/126 |
| 5,382,846 | 1/1995 | Shigehara et al. | 326/68 |
| 5,486,778 | 1/1996 | Lou | 326/83 |
| 5,488,321 | 1/1996 | Johnson | 327/67 |

FOREIGN PATENT DOCUMENTS

| | | |
|---|---|---|
| 0263006 | 4/1988 | European Pat. Off. |
| 2292280 | 6/1976 | France |
| 59-191936 | 10/1984 | Japan |
| 62-234705 | 9/1988 | Japan |
| 6-216745 | 8/1994 | Japan |

OTHER PUBLICATIONS

Vu et al., "The Performance of Source-Coupled FET Logic Circuits that Use GaAs MESFET's", 23 (1988) Feb., No. 1, New York, NY, USA, 8107 I.E.E.E. Journal of Solid State Circuits.

Ishihara, N., "9GHZ Bandwidth, 8-20DB Controllable-Gain Monolithic Amplifier Using AIGAASS/GAAS HBT Technology", Electronic Letters, vol. 25, No. 19, Sep. 14, 1989.

*Primary Examiner*—Edward P. Westin
*Assistant Examiner*—Jon Santamauro
*Attorney, Agent, or Firm*—Rabin, Champagne & Lynt, P.C.

[57] ABSTRACT

An object of the present invention is to provide a buffer circuit little sensitive to a deviation from a threshold voltage of each of transistors. In order to achieve the above object, the present invention provides a typical buffer circuit comprising the following components. Namely, the buffer circuit comprises a first transistor having a first terminal connected to a current source, a second terminal connected to a first node and a control electrode connected to a first input terminal; a second transistor having a first terminal connected to the current source, a second terminal connected to a second node and a control electrode connected to a second input terminal; a third transistor having a first terminal connected to a first source node, a second terminal connected to the first node and a control electrode connected to a first output terminal; a fourth transistor having a first terminal connected to the first source node, a second terminal connected to the second node and a control electrode connected to a second output terminal; a fifth transistor having a first terminal connected to the first output terminal, a second terminal connected to the first source node and a control electrode connected to the first node; and a sixth transistor having a first terminal connected to the second output terminal, a second terminal connected to the first source node and a control electrode connected to the second node.

15 Claims, 3 Drawing Sheets

BUFFER CIRCUIT AND BIAS CIRCUIT

BACKGROUND OF THE INVENTION

1. Field of the Invention

This invention relates particularly to a buffer circuit and a bias circuit both of which electrically process signals such as small amplitude signals (each corresponding to a signal in which the difference between a voltage level indicative of a high logical level and a voltage level indicative of a low logical level is small, such as a signal whose amplitude is of 200 mV with a substantially central level between a ground potential and 2 V as the center when a source potential level is of 2 V).

2. Description of the Related Art

This type of buffer circuit includes a transistor provided on the signal input side and a transistor provided on the signal output side. In the buffer circuit, a small amplitude signal having a voltage level in the vicinity of a threshold voltage of a transistor thereof is inputted to the signal input side transistor. Further, a small amplitude signal having a voltage level in the vicinity of a threshold voltage of a transistor provided within an external circuit for receiving the output of the buffer circuit therein is outputted from the signal output side transistor.

The buffer circuit, which electrically handles the small amplitude signals referred to above, can transfer signals at high speed as compared with a buffer circuit composed of transistors whose switching operations are performed in the saturation region. Thus, the buffer circuit is used particularly in an electronic circuit that needs a high-speed operation.

In a semiconductor manufacturing step, however, there may be cases where a threshold voltage of each of the transistors deviates slightly from a design value due to variations of manufacture which take place while manufacturing the transistors. The deviation of the threshold voltage of each transistor from the design value is a significant factor which exerts a bad influence on the operation of the buffer circuit. Thus, a buffer circuit has been desired which is insensitive to the deviation from the threshold voltage of the transistor.

SUMMARY OF THE INVENTION

With the foregoing in view, it is therefore an object of the present invention to provide a buffer circuit which is insensitive to deviations from threshold voltages of transistors.

According to one aspect of the present invention, for achieving the above object, there is provided a typical buffer circuit comprising a first transistor having a first terminal connected to a current source, a second terminal connected to a first node and a control electrode connected to a first input terminal for receiving a first input signal; a second transistor having a first terminal connected to the current source, a second terminal connected to a second node and a control electrode connected to a second input terminal for receiving a second input signal; a third transistor having a first terminal connected to a first source node supplied with a first source potential level, a second terminal connected to the first node and a control electrode connected to a first output terminal; a fourth transistor having a first terminal connected to the first source node, a second terminal connected to the second node and a control electrode connected to a second output terminal; a fifth transistor having a first terminal connected to the first output terminal, a second terminal connected to the first source node and a control electrode connected to the first node; and a sixth transistor having a first terminal connected to the second output terminal, a second terminal connected to the first source node and a control electrode connected to the second node.

BRIEF DESCRIPTION OF THE DRAWINGS

While the specification concludes with claims particularly pointing out and distinctly claiming the subject matter which is regarded as the invention, it is believed that the invention, the objects, features and advantages thereof will be better understood from the following description taken in connection with the accompanying drawings in which:

DETAILED DESCRIPTION OF THE PREFERRED EMBODIMENTS

Preferred embodiments of a buffer circuit and bias circuits according to the present invention will hereinafter be described in detail with reference to the accompanying drawings.

Figure 1:
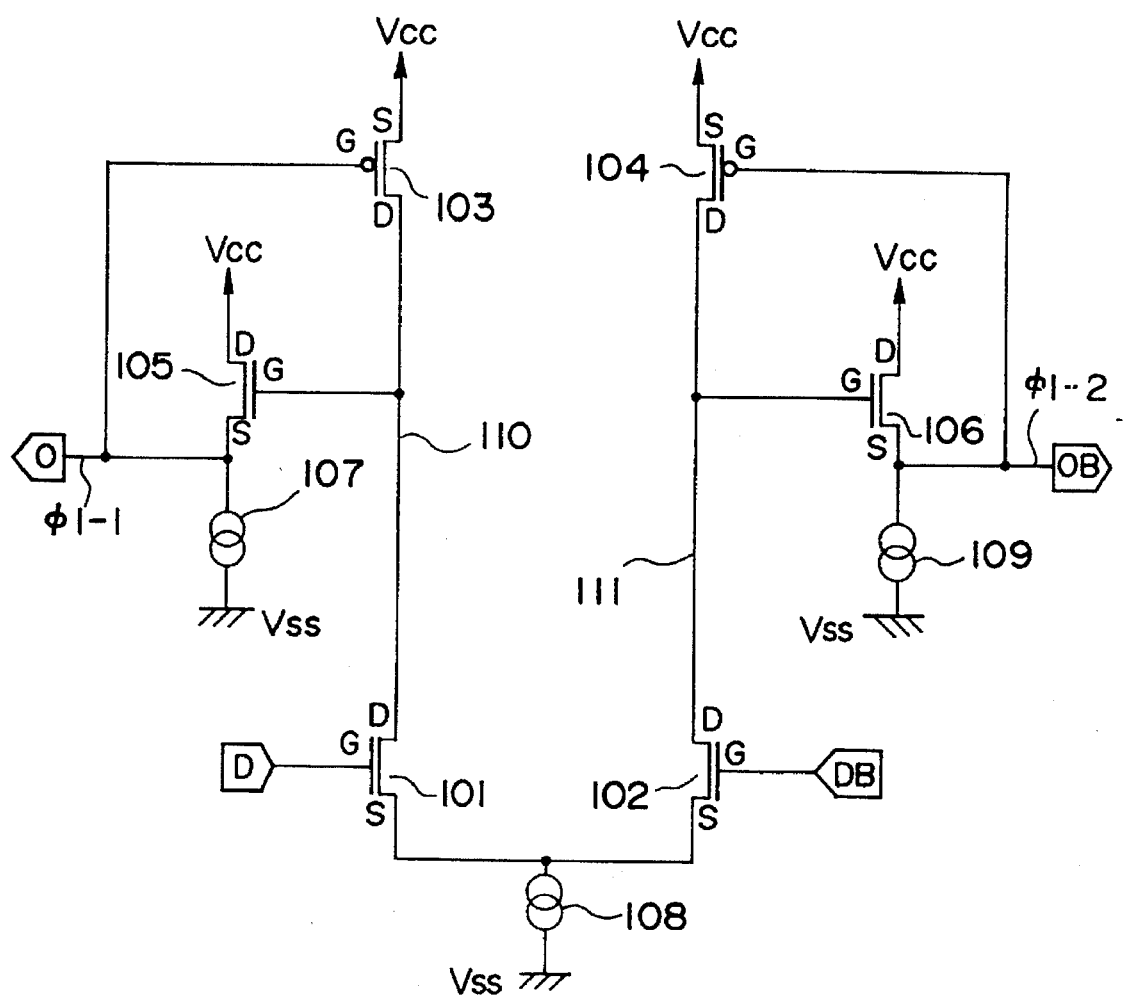
FIG. 1 is a view showing a buffer circuit of the present invention.

FIG. 1 is a circuit diagram showing one embodiment of a buffer circuit according to the present invention. The buffer circuit inputs and outputs small amplitude signals and is composed of field effect transistors (hereinafter called simply "MOS transistors") formed on a semiconductor substrate. The buffer circuit inputs complementary small amplitude signals received at input terminals D and DB and outputs complementary small amplitude signals corresponding to the small amplitude signals from output terminals O and OB without being affected by variations in threshold voltages of the MOS transistors. Now, each of the small amplitude signals shows a signal in which the difference between a voltage level indicative of a high logical level and a voltage level indicative of a low logical level is small. When a source potential level is of 2 V, for example, the small amplitude signal means a signal whose amplitude is of 200 mV with a substantially central level between a ground potential and 2 V as the center.

The buffer circuit includes NMOSs 101 and 102 to which the complementary small amplitude signals are inputted, and a current source 108. The NMOSs 101 and 102 have the same dimension (which is defined by a gate length W and a gate width L, for example).

The NMOS 101 has a gate G electrically connected to the input terminal D supplied with one of the complementary signals, a drain D electrically connected to a node 110 and a source S electrically connected to the current source 108. The NMOS 102 has a gate G electrically connected to the input terminal DB supplied with the other of the complementary signals, a drain D electrically connected to a node 111 and a source S electrically connected to the current source 108. The current source 108 is electrically connected between the sources S of the NMOSs 101 and 102 and the ground potential $V_{ss}$.

The buffer circuit further includes negative feedback controlled PMOSs 103 and 104. The PMOSs 103 and 104 have the same dimension (which is defined by a gate length W and a gate width L, for example).

The PMOS 103 has a source S electrically connected to a source potential $V_{cc}$, a drain D electrically connected to the node 110 and a gate G electrically connected to a node φ1-1 connected to the output terminal O. The PMOS 104 has a source S electrically connected to the source potential $V_{cc}$, a drain D electrically connected to the node 111 and a gate G electrically connected to a node φ1-2 connected to the output terminal OB. The value of a resistance between the source S and drain D of the PMOS 103 is controlled by a potential which appears at the node φ1-1. Similarly, the value of a resistance between the source S and drain D of the PMOS 104 is controlled by a potential which appears at the node φ1-2.

Furthermore, the buffer circuit includes NMOSs 105 and 106, a current source 107 and a current source 109. The NMOSs 105 and 106 have the same dimension (which is defined by a gate length W and a gate width L, for example).

The NMOS 105 has a drain D electrically connected to the source potential $V_{cc}$, a source S electrically connected to the node φ1-1 and a gate G electrically connected to the node 110. The NMOS 106 has a drain D electrically connected to the source potential $V_{cc}$, a source S electrically connected to the node φ1-2 and a gate G electrically connected to the node 111. The current source 107 is electrically connected between the source S of the NMOS 105 and the ground potential $V_{ss}$. The current source 109 is electrically connected between the source S of the NMOS 106 and the ground potential $V_{ss}$.

The operation of the buffer circuit shown in FIG. 1 will now be described.

When the small amplitude signal inputted to the input terminal D rises in potential, for example, a current that flows through the NMOS 101, increases and a current that flows through the NMOS 102, decreases. As a result, the potential at the node 110 is reduced. When the potential at the node 110 drops, the potential applied to the gate G of the NMOS 105 is reduced. As a result, the value of a resistance between the source S and drain D of the NMOS 105 increases. Thus, the potential at the node φ1-1 becomes a potential determined by the current source 107. Namely, the voltage at the output node φ1-1 is also reduced in response to the potential at the node 110.

On the other hand, when the potential at the output node φ1-1 is lowered and the potential applied to the gate G of the PMOS 103 activated as a variable resistor in the non-saturation region decreases, the resistance between the source S and drain D of the PMOS 103 is reduced. When this resistance is reduced, a current that flows between the source S and drain D of the PMOS 103, increases. When the resistance between the source S and drain D of the PMOS 103 is lowered, the potential at the node 110 tends to rise. In response to the rise in potential at the node 110, the NMOS 105 provides negative feedback to avoid an excessive reduction in potential at the output node φ1-1. It is thus possible to output a stable small amplitude signal from the output terminal O.

Since the potential at the input terminal DB is low at this time, the potential applied to the gate G of the NMOS 102 becomes lower than that applied to the gate G of the NMOS 101. As a result, the current that flows between the source S and drain D of the NMOS 102 decreases. Thus, since the potential at the node 111 rises and the potential of the gate G of the NMOS 106 is raised, a current that flows between the source S and drain D of the NMOS 106, increases. Accordingly, the potential at the output node φ1-2 is also increased in response to the potential at the node 111.

Since the potential at the gate G of the PMOS 104 activated as a variable resistor in the non-saturation region rises as the potential at the output node φ1-2 increases, a current which flows between the source S and drain D of the PMOS 104, is reduced. When the current is decreased, the potential at the node 111 tends to drop. In response to the drop in potential at the node 111, the NMOS 106 provides negative feedback to avoid an excessive rise in potential at the output node φ1-2. Thus, according to the present embodiment, a small amplitude signal stable toward a variation in threshold voltage of each transistor can be obtained from the output terminal OB. According to the present embodiment as well, the negative feedback is provided after the level of the output node has varied. Namely, the present embodiment is capable of operating at quicker speed because it is not affected by initial variations in levels of the nodes 110 and 111.

A description will now be made of the case where each of threshold voltages of transistors (threshold voltage of NMOS: $V_{tn}$ and threshold voltage of PMOS: $V_{tp}$) deviates from a target value (design value). For example, there are considered four cases in which the threshold voltages of the transistors deviate from the target value. As the first case, may be mentioned a case where the threshold voltage $V_{tp}$ of the PMOS 103 included in a portion on the left side of the circuit shown in FIG. 1 becomes greater than the target value and the potential at the node 110 becomes lower than the target value. Since the potential at the output node φ1-1 is also lower than the target value at this time, more current flows in the PMOS 103. As a result, the potential at the node 110 can be prevented from dropping. The PMOS 104 included in a portion on the right side of the circuit shown in FIG. 1 is also activated in a manner similar to the PMOS 103.

The second case corresponds to a case in which the threshold voltage $V_{tp}$ of the PMOS 103 included in the portion on the left side of the circuit shown in FIG. 1 becomes lower than the target value and the potential at the node 110 becomes higher than the target value. Since the potential at the output node φ1-1 also rises at this time, the current that flows through the PMOS 103 is restricted so that a rise in potential applied to the node 110 can be suppressed. Further, the PMOS 104 included in the portion on the right side of the circuit shown in FIG. 1 is also activated in a manner similar to the PMOS 103.

The third case shows a case where the threshold voltage $V_{tn}$ of the NMOS 101 included in the portion on the left side of the circuit shown in FIG. 1 becomes lower than the target value and the potential at the output node φ1-1 becomes lower than the target value. At this time, more current flows through the PMOS 103 so that the potential at the node 110 is increased. Since the NMOS 105 tends to turn on easier as the potential at the node 110 increases, the potential applied to the output node φ1-1 can be prevented from dropping. The NMOS 102 included in the portion on the right side of the circuit shown in FIG. 1 is also activated in the same manner as described above.

The fourth case shows a case where the threshold voltage $V_{tn}$ of the NMOS 101 included in the portion on the left side of the circuit shown in FIG. 1 becomes higher than the target value and the potential applied to the output node φ1-1 becomes greater than the target value. At this time, the current that flows through the PMOS 103, is restricted so that the potential at the node 110 is reduced. Since the NMOS 105 tends to turn off easier as the potential at the node 110 decreases, a rise in potential applied to the output node φ1-1 can be suppressed. Further, the NMOS 102 included in the portion on the right side of the circuit shown in FIG. 1 is also activated in the same manner as described above.

Thus, even if the threshold voltages ($V_{tn}$ and $V_{tp}$) of the transistors deviate from the target value, it is possible to compensate for the current that flows in each of the nodes 110 and 111. Therefore, the potential of the small amplitude signal outputted from each of the output terminals O and OB has less deviation from the target value.

According to the embodiment of the buffer circuit shown in FIG. 1, as has been described in detail above, since the gate G of the PMOS 103 is electrically connected to the output terminal O and the gate G of the PMOS 104 is electrically connected to the output terminal OB, the negative feedback is provided so as to prevent the level of each output node from excessively rising and dropping. Since the negative feedback is provided after the level of each output node has varied, the buffer circuit can be activated at quicker speed. Further, even if the threshold voltages ($V_{tn}$ and $V_{tp}$) of the transistors deviate from the target value, the values of the resistances between the source S and drain D of the PMOS 103 and between the source S and drain D of the PMOS 104 are suitably adjusted so as to compensate for the deviations. Thus, the potentials applied to the gates G of the NMOSs 105 and 106 can be adjusted so that influences exerted on the small amplitude signals outputted from the output terminals O and OB are less.

Figure 2:
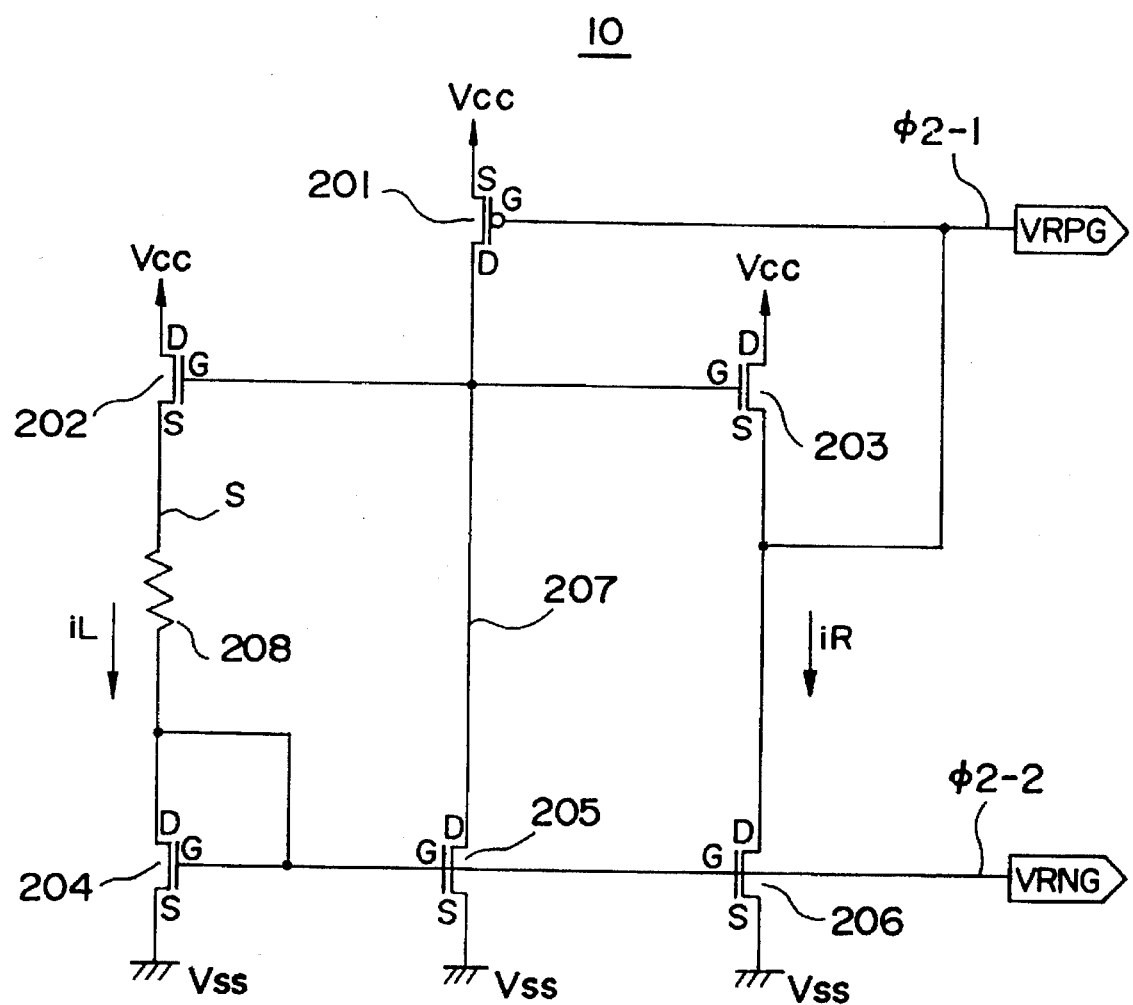
FIG. 2 is a view illustrating a first embodiment of a bias circuit of the present invention.

FIG. 2 shows a bias circuit 10 according to the present invention. The bias circuit 10 also includes a negative feedback circuit therein.

The bias circuit 10 is a bias circuit provided with an output terminal VRPG for outputting a bias voltage independent of variations in threshold voltages of transistors and an output terminal VRNG for outputting a bias voltage independent of a source potential $V_{cc}$. The bias circuit 10 is composed of a PMOS 201, NMOSs 202 through 206 and a resistor 208.

The PMOS 201 has a source S electrically connected to the source potential $V_{cc}$, a drain D electrically connected to a node 207 and a gate G electrically connected to the output terminal VRPG through an output node φ2-1. The NMOSs 202 and 203 are of transistors identical in dimension to each other and whose drains D and gates G are respectively electrically connected to the source potential $V_{cc}$ and the node 207.

Further, the NMOS 202 has a source S electrically connected to a drain D of the NMOS 204 through the resistor 208. The NMOS 203 has a source S electrically connected to a drain D of the NMOS 206 and the output node φ2-1 so that the PMOS 201 is controlled under negative feedback. Since the PMOS 201 and the NMOS 203 are electrically connected in the above-described manner, the bias voltage to be outputted from the output terminal VRPG can be outputted as a voltage independent of threshold voltages of the PMOS 201 and NMOS 203.

The NMOSs 204 and 206 are of transistors identical in dimension to each other. The NMOSs 204 and 206 respectively have sources S electrically connected to a ground potential $V_{ss}$ and gates G electrically connected to the output terminal VRNG through an output node φ2-2. Further, the gate G of the NMOS 204 is also electrically connected to its own drain D. The NMOS 205 has a source S electrically connected to the ground potential $V_{ss}$, a drain D electrically connected to the node 207 and a gate G electrically connected to the output terminal VRNG through the output node φ2-2.

The operation of the bias circuit 10 will be described below.

Four cases in which a threshold voltage $V_t$ of a PMOS or NMOS deviates from a target value, are considered as examples. As the first case, may be mentioned a case where the absolute value of a threshold voltage $V_{tp}$ of the PMOS 201 becomes higher than the target value. In this case, a conducting state of the PMOS 201 becomes weak as compared with the time when the threshold voltage $V_{tp}$ is of the target value. Therefore, the potential at the node 207 is reduced as compared with the time when the threshold voltage $V_{tp}$ is of the target value. Thus, since the potential applied to the gate G of the NMOS 203 becomes lower than the target value, the level of the potential applied to the output node φ2-1 is also reduced. Since, however, this potential level is applied to the gate G of the PMOS 201, a current, which flows through the PMOS 201, increases and is adjusted so as to suppress a reduction in potential level of the node 207. Thus, since the negative feedback is provided for the PMOS 201, an influence exerted on the bias voltage outputted from the output terminal VRPG is less provided even if the threshold voltage $V_{tp}$ of the PMOS 201 becomes higher than the target value.

The second case shows a case in which the absolute value of the threshold voltage $V_{tp}$ of the PMOS 201 becomes lower than the target value and the potential level of the node 207 becomes higher than the target value. In this case, negative feedback is provided for increasing the potential level of the output node φ2-1 and restricting the flow of the current through the PMOS 2φ1 so as to suppress a rise in potential level of the node 207.

The third case shows a case where a threshold voltage $V_{tn}$ of the NMOS 203 becomes lower than the target value and the potential level of the output node φ2-1 becomes higher than the target value. In this case, negative feedback is provided for reducing the potential level of the node 207 and suppressing a rise in potential level of the output node φ2-1.

The fourth case shows a case in which the threshold voltage $V_{tn}$ of the NMOS 203 becomes higher than the target value and the potential level of the output node φ2-1 becomes lower than the target value. In this case, negative feedback is provided for increasing the potential level of the node 207 and preventing the potential level of the output node φ2-1 from reduction. Thus, the output node φ2-1 is less affected by $\Delta V_{tp}$ and $\Delta V_{tn}$ defined in a range of variations in threshold voltages of the transistors owing to the negative feedback provided for the PMOS 201. It is therefore possible to output a constant voltage insensitive to the variations in threshold voltages of the transistors from the output terminal VRPG.

Further, since the gates G of the NMOSs 202 and 203 are electrically connected to the node 207, a current iR that flows through the output node φ2-1, is equal to a current iL that flows through the output node φ2-2. Thus, the relationship between both is expressed as follows:

$$iL = iR$$

A value $V_s$ of a voltage applied to a node s is equal to a value $V_{rpg}$ of a voltage applied to the output node φ2-1. Thus, the relationship between both is expressed as follows:

$$V_s = V_{rpg}$$

The voltage value $V_{rpg}$ is equal to a voltage obtained by subtracting a voltage drop $V_{no}$ developed across the NMOS 203 from the source potential $V_{cc}$. Thus, the relationship between both is expressed as follows:

$$V_{rpg} = V_{cc} - V_{no}$$

A voltage drop $V_{ro}$ developed across the resistor 208 is determined from a resistance value R(Ω) of the resistor 208 and the current value iL. Thus, the voltage drop $V_{ro}$ is expressed as follows:

$$V_{ro}=R*iL$$

Thus, a value $V_{rng}$ of a voltage applied to the output node φ2-2 is represented as follows:

$$V_{rng}=V_{rpg}-V_{ro}=V_{cc}-V_{no}iL*R$$

Since the iL is proportional to the $V_{cc}$, the $V_{rng}$ is rewritten as follows:

$$V_{rng}=V_{cc}(1-kR)-V_{no}$$

As the $V_{rng}$, a reference level independent on the $V_{tp}$ and $V_{cc}$ is obtained by increasing R.

According to the bias circuit 10 shown in FIG. 2 in this way, a reference level $V_{rpg}$ less affected by $\Delta V_{tp}$ and $\Delta V_{tn}$ can be obtained by electrically connecting the gate G of the PMOS 201 to the sources of the NMOS 203 and electrically connecting the drain D of the PMOS 201 and the gate G of the NMOS 203 to each other.

By electrically connecting the resistor 208 sufficiently large in capacity between the source S of the NMOS 202 and the drain D of the NMOS 204, electrically connecting the source S of the NMOS 203 identical in dimension to that of the NMOS 202 and the drain D of the NMOS 206 NMOS identical in dimension to that of the NMOS 204 to each other, electrically connecting the gates G of the NMOSs 202 and 203 to the common node 207 and electrically connecting the drain D and gate G of the NMOS 204 and the gate G of the NMOS 206 to the output node φ2-2, a reference level $V_{rng}$ independent on $\Delta V_{tp}$ and $V_{cc}$ can be obtained.

Figure 3:
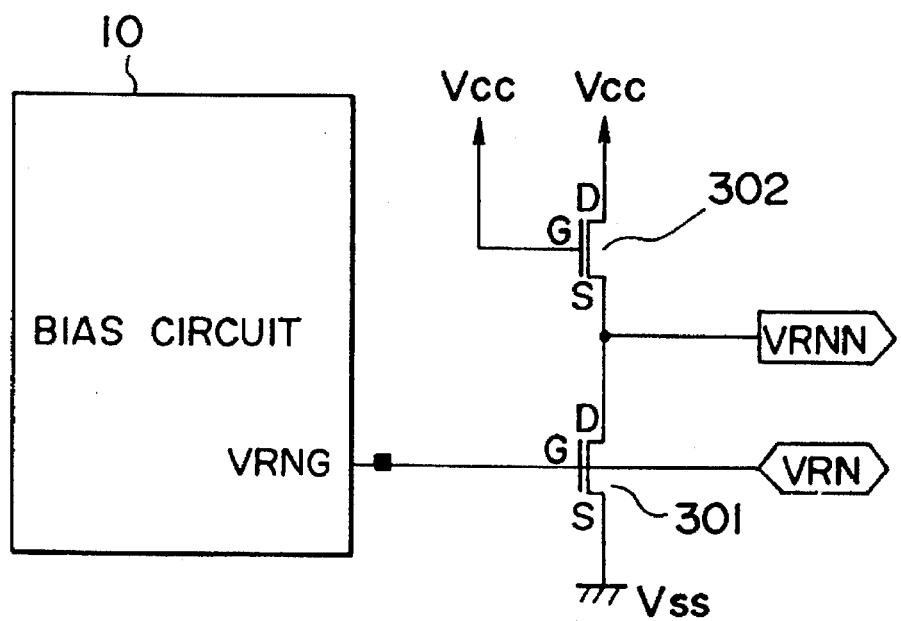
FIG. 3 is a view depicting a second embodiment of a bias circuit of the present invention.

FIG. 3 is a circuit diagram showing a second embodiment of a bias circuit.

The bias circuit is a bias circuit provided with an input/output terminal VRN and an output terminal VRNN. The present bias circuit is composed of the bias circuit 10 shown in FIG. 2 and transistors of NMOSs 301 and 302. The input/output terminal VRN is electrically connected to the output terminal VRNG of the bias circuit 10. The NMOS 301 has a gate G electrically connected to the input/output terminal VRN, a drain D electrically connected to the output terminal VRNN and a source S electrically connected to a ground potential $V_{ss}$. Further, the NMOS 302 has a drain D and a gate G both electrically connected to a source potential $V_{cc}$ and a source S electrically connected to the output terminal VRNN.

The operation of the bias circuit shown in FIG. 3 will now be described.

Since the VRN terminal is electrically connected to the output terminal VRNG of the bias circuit 10, the voltage applied to the drain D of the NMOS 204 rises as the threshold voltage $V_{tn}$ of the NMOS 204 shown in FIG. 2 becomes greater than a target value. Therefore, the voltage at the input/output terminal VRNG is also raised in response to the voltage rise referred to above. Accordingly, the voltage at the input/output terminal VRN is also increased.

The NMOS 301 is also placed under the influence of a variation in manufacture or a change in temperature characteristic, which is similar to the threshold voltage $V_{tn}$ of the NMOS 204. Thus, since the voltage applied to the gate G of the NMOS 301 rises with an increase in threshold voltage $V_{tn}$ of the NMOS and a threshold voltage $V_{tn}$ of the NMOS 301 is also raised in the same manner as described above, the state of conduction of the NMOS 301 is substantially equivalent to that at the time that the threshold voltage $V_{tn}$ is of the target value. As a result, a current, which flows between the source S and drain D of the NMOS 301 remains unchanged. Further, since a current that flows through the NMOS 302, is kept constant regardless of the threshold voltage $V_{tn}$ thereof, a voltage $V_{GS}$ of the NMOS 302 becomes large as the threshold voltage $V_{tn}$ increases. Since a voltage $V_g$ applied to the gate G of the NMOS 302 is of $V_{cc}$, the output terminal VRNN is supplied with a reference level reduced by $\Delta V_{tn}$ when the threshold voltage $V_{tn}$ rises.

Thus, according to the bias circuit of the second embodiment, the reference level reduced by the rise in threshold voltage $V_{tn}$ when the threshold voltage $V_{tn}$ becomes higher than the target value, can be obtained at the output terminal VRNN by electrically connecting the input/output terminal VRN to the output terminal VRNG of the bias circuit 10, electrically connecting the gate G of the NMOS 301 to the input/output terminal VRN, electrically connecting the drain D of the NMOS 301 to the source S of the NMOS 302 and electrically connecting a node between both the drain D thereof and the source S thereof to the output terminal VRNN.

Thus, the dependence of the central potential between the potentials of the small amplitude signals outputted from the nodes φ1-1 and φ1-2 on the threshold voltage $V_{tn}$ can be reduced by applying the reference level having a negative dependence on the variation in threshold voltage $V_{tn}$ to each of the current sources 107 and 109 in the buffer circuit shown in FIG. 1 by way of example.

Figure 4:
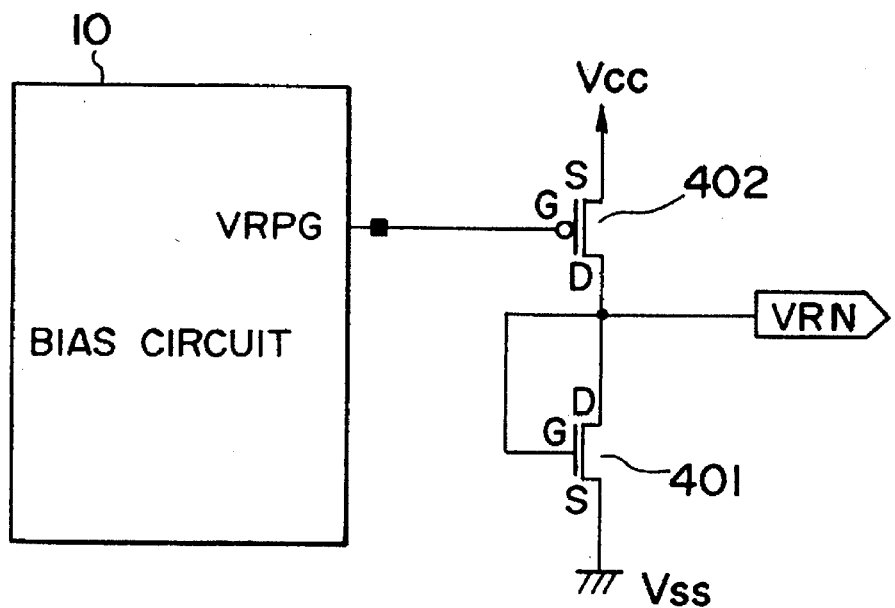
FIG. 4 is a view showing a third embodiment of a bias circuit the present invention.

FIG. 4 shows a third embodiment of a bias circuit. The bias circuit comprises the bias circuit 10 shown in FIG. 2, an NMOS 401 and a PMOS 402. The PMOS 402 has a source S electrically connected to a source potential $V_{cc}$, a gate G electrically connected to the output terminal VRPG of the bias circuit 10 and a drain D electrically connected to an output terminal VRN. Further, the NMOS 401 has a source S electrically connected to a ground potential $V_{ss}$ and a drain D and a gate G both electrically connected to the output terminal VRN.

The operation of the bias circuit will be described.

A reference level at the output terminal VRPG of the bias circuit 10 does not depend on the threshold voltages $V_{tn}$ and $V_{tp}$ of the transistors that form the bias circuit 10. Thus, when the threshold voltage $V_{tp}$ becomes higher than a target value, a current that flows through the PMOS 402 is reduced. As a result, a reference level at the output terminal VRN is lowered by a change in threshold voltage $V_{tp}$. Further, when the threshold voltage $V_{tn}$ becomes higher than the target value, the value of a resistance between the source S and drain D of the NMOS 401 becomes great. As a result, the reference level at the output terminal VRN is increased by a change in threshold voltage $V_{tn}$.

According to the third embodiment of the bias circuit as described above, since the gate G of the PMOS 402 is electrically connected to the output terminal VRPG of the bias circuit 10 and the drain D of the PMOS 402 and the drain D and gate G of the NMOS 401 are respectively electrically connected to the output terminal VRN, the reference level reduced by the change in threshold voltage $V_{tp}$ of the PMOS transistor can be obtained as the level of the output terminal VRN when the threshold voltage $V_{tp}$ thereof rises and the reference level increased by the change in threshold voltage $V_{tn}$ of the NMOS transistor can be obtained as the level of the output terminal VRN when the threshold voltage $V_{tn}$ thereof increases.

Further, the influence of an output against deviations from the threshold voltages $V_{tn}$ and $V_{tp}$ can be reduced by using the reference levels to control the current source 108 of the buffer circuit shown in FIG. 1.

The bias circuits shown in FIGS. 2, 3 and 4 can be used to control the current source or the like of the buffer circuit shown in FIG. 1. However, the influence of an output against the deviations form the threshold voltages due to variations in manufacture and variations in temperature characteristics can be reduced by using the bias circuits to control current sources such as a voltage control type delay cell, etc.

These embodiments described herein are intended to describe the present invention. The present invention is not necessarily limited to the embodiments. Namely, the present embodiments have described the case in which the circuit is composed of the field effect transistors to which the present invention is applied with advantage. However, the technical idea of the present invention can be applied even to bipolar transistors.

According to the present invention as described above, the signal having the potential level which approximates to the target value, can be outputted even when the threshold voltage varies due to the variations in manufacture or the like.

According to the buffer circuit of the present invention as well, even if the threshold voltage varies due to the variations in manufacture or the like, the stable small amplitude signal can be outputted by performing the control of the negative feedback over the potential on the output side.

Further, according to the bias circuit of the present invention, even if the threshold voltage varies due to the variations in manufacture or the like, the stable bias voltage can be outputted by performing the control of the negative feedback over the potential on the output side. Further, the bias voltage independent on the variation in source potential can be outputted by setting the resistance value of the resistor to a sufficiently large value.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A buffer circuit comprising:

a first transistor of a first conductivity type having a first terminal connected to a first current source, a second terminal connected to a first node, and a control electrode connected to a first input terminal for receiving a first input signal;

a second transistor of the first conductivity type having a first terminal connected to the first current source, a second terminal connected to a second node, and a control electrode connected to a second input terminal for receiving a second input signal;

a third transistor of a second conductivity type having a first terminal connected to a first source node supplied with a first source potential level, a second terminal connected to the first node, and a control electrode connected to a first output terminal;

a fourth transistor of the second conductivity type having a first terminal connected to the first source node, a second terminal connected to the second node, and a control electrode connected to a second output terminal;

a fifth transistor of the first conductivity type having a first terminal connected to the first output terminal, a second terminal connected to the first source node, and a control electrode connected to the first node;

a second current source connected between the first output terminal and a second source node supplied with a second source potential level lower than the first source potential level;

a sixth transistor of the first conductivity type having a first terminal connected to the second output terminal, a second terminal connected to the first source node, and a control electrode connected to the second node; and a third current source connected between the second output terminal and the second source node supplied with the second potential level.

2. A buffer circuit according to claim 1, wherein said first, second, third, fourth, fifth and sixth transistors are MOS transistors.

3. A buffer circuit according to claim 2, wherein said first, second, fifth and sixth MOS transistors are NMOS transistors, and wherein said third and fourth MOS transistors are PMOS transistors.

4. A buffer circuit according to claim 1, wherein each of the first and second input terminals is supplied with a potential level between the first source potential level and the second source potential level.

5. A buffer circuit according to claim 1, wherein the first and second input terminals are for receiving first and second input signals which are complementary to each other.

6. A buffer circuit comprising:

a first signal inputting circuit having a first terminal coupled to a first node, a second terminal coupled to a first source potential terminal applied to a first source potential level, and a control terminal for receiving a first input signal;

a second signal inputting circuit having a third terminal coupled to a second node, a fourth terminal coupled to the first source potential terminal, and a control terminal for receiving a second input signal;

a first level shifting circuit having an input terminal coupled to the first node, an output terminal coupled to a first output terminal and the first source potential terminal, and a fifth terminal coupled to a second source potential terminal which is applied to a second source potential higher than the first source potential level, for raising a potential level of the first output terminal when the potential level of the first node is raised and reducing the potential level of the first output terminal when the potential level of the first node is reduced;

a second level shifting circuit having an input terminal coupled to the second node, an output terminal coupled to a second output terminal and the first source potential terminal, and a sixth terminal coupled to the second source potential terminal, for raising a potential level of the second output terminal when the potential level of the second node is raised and reducing the potential level of the second output terminal when the potential level of the second node is reduced;

a first feed-back circuit having a seventh terminal coupled to the second source potential terminal, an eighth terminal coupled to the first node, and a control terminal for receiving the potential level of the first output terminal, for controlling coupling between the second source potential terminal and the first node in response to the potential level of the first output terminal; and a second feed-back circuit having a ninth terminal coupled to the second source potential terminal, a tenth terminal coupled to the second node, and a control terminal for receiving the potential level of the second output terminal, for controlling coupling between the second source potential terminal and the second node in response to the potential level of the second output terminal.

7. A buffer circuit according to claim 6, wherein said first level shifting circuit comprises a MOS transistor and a current source, wherein:

the MOS transistor has a drain electrode as the fifth terminal coupled to the second source potential terminal, a source electrode as the output terminal coupled to the first output terminal, and a gate electrode as the input terminal coupled to the first node; and the current source is coupled between the source electrode of the MOS transistor and the first source potential terminal.

8. A buffer circuit according to claim 7, wherein said MOS transistor comprises an N-type MOS transistor.

9. A buffer circuit according to claim 6, wherein said first feed-back circuit comprises a MOS transistor having a drain electrode as the eighth terminal coupled to the first node, a source electrode as the seventh terminal coupled to the second source potential terminal, and a gate electrode as the control terminal coupled to the first output terminal.

10. A buffer circuit according to claim 9, wherein said first feed-back circuit MOS transistor comprises a P-type MOS transistor.

11. A buffer circuit according to claim 6, wherein said first signal inputting circuit is for receiving the first input signal having a potential level between the first and second source potential levels.

12. A buffer circuit according to claim 6, wherein said second signal inputting circuit is for receiving the second input signal having a potential level between the first and second source potential levels.

13. A buffer circuit according to claim 6, wherein the first and second input terminals are for receiving first and second input signals which are complimentary to each other.

14. A buffer circuit according to claim 6, wherein the first and second output terminals are for outputting first and second output signals which are complimentary to each other.

15. A buffer comprising:

input means, including a pair of transistors, for receiving complementary first and second input signals;

output means, including a pair of transistors, coupled to the input means, for outputting complementary first and second output signals corresponding to the respective complementary first and second input signals; and feedback means, including a pair of transistors, coupled to the input means and the output means for feeding back a portion of the respective output signals;

wherein, the input means, the output means and the feedback means are configured to compensate for variations in threshold voltages of the transistors.

* * * * *